United States Patent [19]

Puckette

[11] 4,311,922
[45] Jan. 19, 1982

[54] VARIABLE EXCITATION CIRCUIT

[75] Inventor: Charles M. Puckette, Scotia, N.Y.

[73] Assignee: General Electric Company, Schenectady, N.Y.

[21] Appl. No.: 94,178

[22] Filed: Nov. 14, 1979

[51] Int. Cl.³ .................... H03K 17/687; H03K 3/26
[52] U.S. Cl. .................................. 307/270; 307/576; 307/540
[58] Field of Search .............. 307/270, 251, 585, 576, 307/540; 330/264

[56] References Cited

U.S. PATENT DOCUMENTS 4,011,468  3/1977  Fosler, Jr. .......................... 307/270
4,128,813  12/1978  Suzuki et al. ...................... 330/264

Primary Examiner—Stanley D. Miller, Jr.
Assistant Examiner—B. P. Davis
Attorney, Agent, or Firm—Geoffrey H. Krauss; James C. Davis; Marvin Snyder

[57] ABSTRACT

An excitation circuit is disclosed which is responsive to a trigger signal to drive a capacitive load with a controllable high frequency pulse burst. The pulse burst takes the form of a multiple cycle output signal which has a selectively variable high voltage determined by the supply voltage of the circuit. The output signal replicates and is coherent with the trigger signal applied to the circuit. The latter signal thus determines the pulse width and signal duration, i.e. the number of cycles, of the output signal. The circuit is particularly adapted to provide a programmable burst excitation for driving an ultrasound transducer or the like.

12 Claims, 2 Drawing Figures

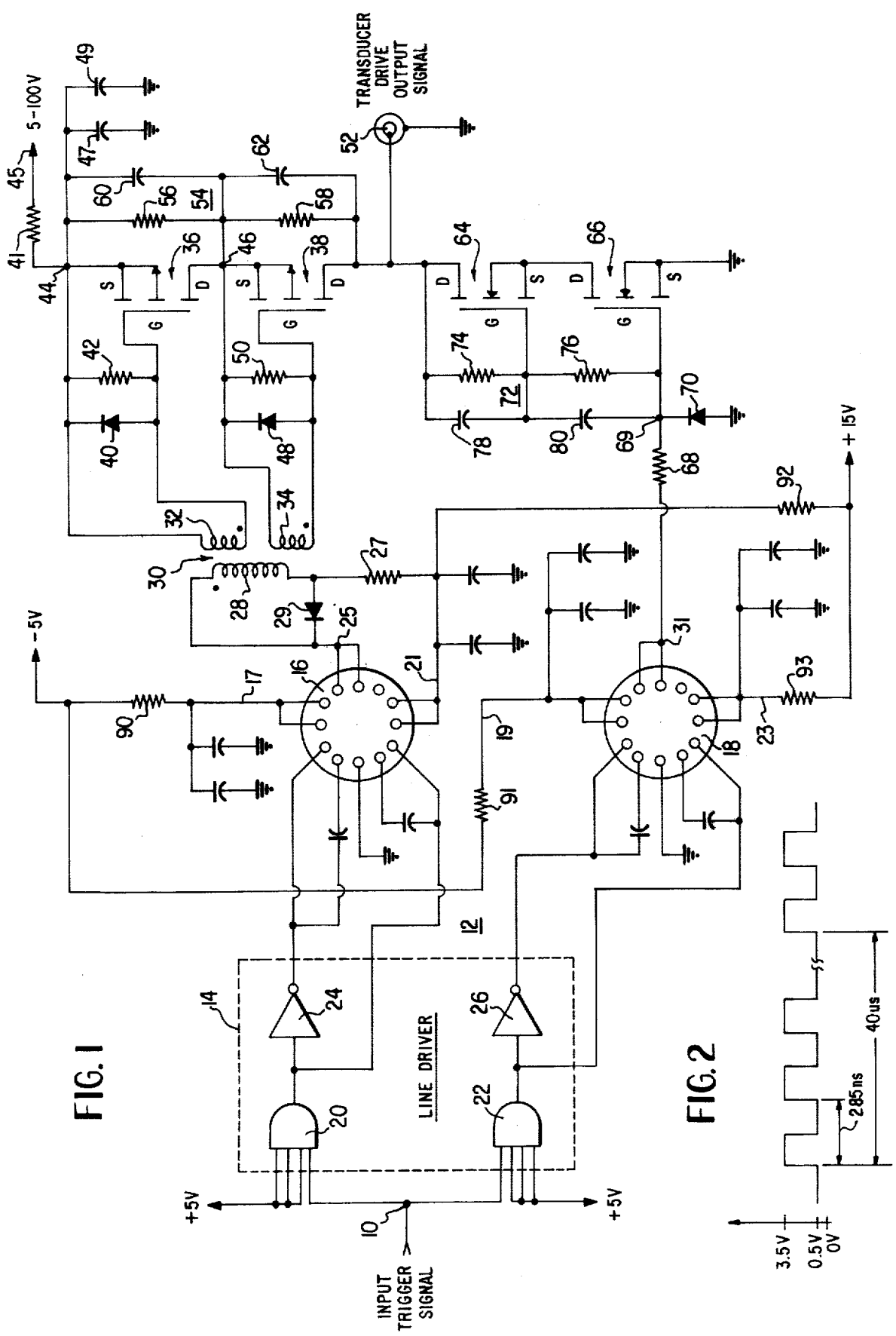

VARIABLE EXCITATION CIRCUIT

The present invention relates in general to a variable excitation circuit, in particular to a circuit adapted to drive an ultrasound transducer with a programmable burst excitation which is coherent with an input trigger signal applied to the circuit.

BACKGROUND OF THE INVENTION

Certain types of applications require a load to be driven with an electrical burst excitation signal of relatively high voltage but brief duration. For example, ultrasonic instruments of the kind used for medical diagnosis often employ an array of piezoelectric transducers. Each transducer represents a capacitive load and must be suitably driven to make its contribution in the generation of a wavefront of ultrasonic energy which is applied to the target under observation, e.g. a portion of the human body. An echo waveform in the form of reflected energy is subsequently received by the transducers. Each transducer must then convert the reflected energy portion received by it back into an electrical signal for subsequent analysis. By phasing the transducer array, the emitted energy is focussed to provide a beam capable of scanning the sector of interest. Steering of the beam to the target may be accomplished by suitably delaying the excitation of respective transducers, while the energy transmitted may be controlled by varying the amplitude of the excitation.

In such an arrangement each transducer typically has its own excitation circuit, which drives the transducer during successive time intervals that alternate with the periods during which the transducer receives the reflected energy. The circuit responds to an input trigger signal which must be compatible with the operating frequency of the transducer. For one type of transducer which has been used for ultrasonic medical applications, the operating frequency range may extend from 2 to $5 \times 10^6$ Hz.

In prior art devices, such as the P100A Series Ultrasonic Pulse Generator made by Metrotek, Inc., excitation is provided by applying a single pulse spike to the transducer. Typically this technique is implemented by firing an SCR to dump the stored charge of a capacitor into the transducer. A major disadvantage of this technique is that only a limited amount of energy can be transferred by means of a single pulse spike. Hence the excitation of the transducer, and consequently the magnitude of the echo reflected from the target, are limited. For example, at a pulse frequency of 3.5 MHz, the pulse width is fixed at approximately 150 nanoseconds and the energy content is thus determined for a given pulse amplitude. While the pulse amplitude may be varied, the full voltage produced in such a circuit divides between the impedance of the capacitor and that of the transducer itself. Therefore the amplitude of the pulse applied to the transducer is reduced and the energy transferred to it is necessarily limited. Furthermore, since the applied pulse amplitude is dependent on the transducer capacitance, manufacturing tolerances associated with the transducer will cause the applied pulse to have a non-controllable variation with different transducers.

Another difficulty arises where transducers are to be driven that operate at different center frequencies. Because of the different operating frequencies, the characteristics of the respective transducers will typically be different. Each transducer will therefore require a unique excitation circuit, one having parameters that are different from those of the driver circuits of the other transducers. Thus the flexibility of interchanging transducers without also interchanging the excitation circuits is lacking and the cost of the overall system is increased.

Since the storage capacitor in prior art driver circuits charges at its own rate before it can be discharged by firing the SCR, the excitation of the transducer cannot be carried out at a rate equal to the transducer center frequency. The excitation of the transducer with a multiple cycle burst at the transducer center frequency, where such multiple cycle burst is phase coherent with another signal, such a system clock signal, is therefore precluded. This limitation presents a distinct disadvantage and it virtually eliminates the possibility of programmed control, i.e. the selective variation of the energy transferred to the transducer by means other than supply voltage variation.

SUMMARY OF THE INVENTION

In accordance with the principles of the present invention, a variable excitation circuit is provided wherein the control of the energy applied to an ultrasonic transducer load, and further by the transducer to a target, may be programmed by selective variation thereof to provide a substantial improvement over prior art excitation circuits. Periodically, a selected number of cycles of a trigger signal, preferably a square wave, is applied at the input of the circuit at a frequency which is centered on the frequency range of the transducer. An output signal is provided at the same frequency and consists of a burst excitation in the form of multiple cycles of a high voltage waveform which is periodically repeated. This output signal, which is applied in full to the load, has a selectively variable amplitude and constitutes a replicated waveform of the input trigger signal. The output signal is coherent with the input trigger signal, i.e. the two signals have a fixed phase relationship with respect to each other. For a given selected amplitude and repetition rate of the output signal, the energy transferred to the transducer may be changed by varying the number of cycles of the trigger signal applied to the input of the excitation circuit. An output signal of identical duration is generated, i.e. a signal having the same number of cycles, the same pulse frequency and one which is replicated at the same rate. The variable excitation circuit disclosed herein may also be used with transducers having different center frequencies by varying the frequency of the individual trigger pulses applied to the input of the excitation circuit.

OBJECTS OF THE INVENTION

It is an object of the present invention to provide a circuit adapted to drive a load with a burst excitation which is selectively variable in amplitude, duration and pulse frequency and which may be repeated at a selectively variable rate.

It is another object of the present invention to provide a circuit for driving a capacitive load with a burst excitation consisting of a selected number of cycles of a high voltage waveform.

It is a further object of the present invention to provide a circuit for driving a capacitive load at ultrasonic frequencies with a burst excitation in the form of multiple cycles of a high voltage waveform of variable amplitude.

It is still another object of the present invention to provide a circuit for applying a selectively variable burst excitation to an ultrasonic transducer in the form of a variable-amplitude, high voltage square wave signal having a selected number of cycles, where such signal coherently replicates a trigger signal applied to the input of the circuit.

It is still a further object of the present invention to program the energy applied to a target by an ultrasonic transducer through the use of a circuit adapted to apply a selectively variable burst excitation to the transducer.

It is yet another object of the present invention to program the ultrasonic beam energy applied to a target by a phased array of ultrasonic transducers where each transducer is energized by a selectively variable burst excitation provided by a circuit which responds to an applied trigger signal.

These and other objects of the present invention together with the features and advantages thereof will become apparent from the following detailed specification when red in conjunction with the accompanying drawings.

BRIEF DESCRIPTION OF THE DRAWINGS

FIG. 1 illustrates a preferred embodiment of the invention in schematic form; and FIG. 2 illustrates an exemplary trigger signal which may be applied to the input of the circuit shown in FIG. 1.

DESCRIPTION OF THE INVENTION

With reference now to FIG. 1, the illustrated circuit includes an input terminal 10 to which an input trigger signal is applied. In a practical embodiment of the invention, the trigger signal is preferably a square wave signal derived from TTL logic which precedes the circuit shown. The TTL logic may, for example, constitute a circuit arrangement of the type shown in U.S. Pat. No. 3,774,167, which is assigned to the assignee of the present application. An example of the trigger signal provided by such a circuit arrangement, for application to terminal 10, is shown in FIG. 2. In the illustrated example, the voltage level switches between +0.5 volt and +3.5 volt in each pulse period of 285 nsec, i.e. the signal has a pulse frequency of $3.5 \times 10^6$ Hz. The duration of the trigger signal in the chosen example is selected to be 3 cycles, or 0.855 usec and it is seen to repeat at 40 usec intervals. It will be clear to those skilled in the art, that the square wave trigger signal illustrated in FIG. 2 may be selectively varied with respect to its pulse frequency; with respect to its duration, as determined by the number of pulse cycles; and with respect to the rate at which it repeats; all in a manner known in the art.

Terminal 10 is connected to a driver section 12 which extends between the input terminal and a pair of driver section output connections designated 25 and 31 in the drawing. The illustrated embodiment of the driver section comprises a dual differential line driver 14 and a pair of high speed MOS drivers 16 and 18. Line driver 14 may comprise an integrated circuit of the type commercially available from National Semiconductor Co. under the designation DS8830. High speed drivers 16 and 18 may consist of a pair of integrated circuit devices available as MH0012C units from the same company. Since units 14, 16 and 18 are well known in the art, a detailed description of their input and output connections is deemed to be unnecessary.

Unit 14 comprises a pair of AND gates 20 and 22, each including one input coupled to input terminal 10. The remaining inputs of each AND gate are tied to a positive voltage, here +5 volts in accordance with accepted convention for unused TTL logic gate inputs. The outputs of AND gates 20 and 22 are coupled to separate inputs of high speed drivers 16 and 18 respectively, by way of a pair of inverters 24 and 26 respectively, as well as through direct and capacitive connections. The outputs of the inverters are connected directly, as well as capacitively, to the high speed drivers.

As shown, power is applied to drivers 16 and 18 at two intermediate value DC voltage levels of opposite polarity. Specifically, drivers 16 and 18 are coupled to a −5 volt source through a pair of driver connections 17 and 19 respectively, which include resistors 90 and 91 respectively. Similarly, a pair of driver connections 21 and 23, which include resistors 92 and 93 respectively, couple drivers 16 and 18 respectively to a +15 volt DC source. Each of the aforesaid resistors 90 to 93 has a pair of capacitors associated therewith, connected in parallel to ground to form a ripple filter with the associated resistor in order to filter out minor perturbations on the applied DC.

Output connection 25 couples high speed driver 16 to one terminal of primary winding 28 of a transformer 30. The opposite terminal of the primary winding is coupled to driver connection 21 by way of a resistor 27, thereby referencing the winding to the +15 volt DC source. A diode 29 is connected across primary winding 28 and is effective to protect high speed driver 16 by shunting surge currents through resistor 27 to the +15 volt source.

Transformer 30 further includes a pair of secondary windings 32 and 34. Correspondingly phased terminals of windings 32 and 34, indicated by a dot notation in FIG. 1, are connected to the gates of a pair of substantially identical, series-connected, solid state switching devices 36 and 38 respectively, each device further including a source and a drain. In a preferred embodiment of the invention, devices 36 and 38 may be P channel type, enhancement mode, VMOS power FET devices, e.g. of the kind which are commercially available from Supertex, Inc. under the designation VP2. The source of switching device 36 is connected to the free terminal of secondary transformer winding 32. A diode 40 and a resistor 42 are connected in parallel across winding 32 and provide protection for device 36 against surge voltages.

The source of device 36 is further connected to a power supply terminal 44, which itself is coupled to a variable power supply 45 by way of a resistor 41. The latter acts to protect the power supply in the event of a short circuit between the output and ground. Further, resistor 41 forms a power supply ripple filter in association with a pair of capacitors 47 and 49, which are connected between terminal 44 and ground. In a preferred embodiment of the invention, terminal 44 is adapted to provide a DC voltage which is selectively variable between +5 and +100 volts.

A cascade connection of the FET switching devices 36 and 38 is formed by connecting the drain of device 36 to a junction point 46 to which the source of device 38 is also tied. Junction point 46 is further connected to the free terminal of the secondary winding 34. The drain of device 38 is directly coupled to an excitation circuit output terminal 52. A diode 48 and a resistor 50 are connected in parallel across winding 34 in order to protect device 38 against surge voltages.

A voltage divider network 54, comprising a pair of resisitive legs 56 and 58 of substantially identical impedance value, is connected to junction point 46. Legs 56 and 58 are further connected to power supply terminal 44 and output terminal 52 respectively, as shown. Two capacitive legs 60 and 62 of substantially identical impedance value are connected in parallel with resistors 56 and 58 respectively and provide frequency compensation by shunting these resistors at the higher frequencies. Voltage divider network 54 causes devices 36 and 38 to share any voltage drop across the cascade of the two devices equally, so that the total voltage that may be used may substantially exceed the rating of either device.

A pair of substantially identical solid state switching devices 64 and 66, each including a gate, a source and a drain, is connected in series between output terminal 52 and a voltage reference point, the latter being at ground in the example under consideration. Specifically, in this cascade connection the drain of device 64 is connected to output terminal 52, its source is connected to the drain of device 66 and the source of the latter is connected to ground. In a preferred embodiment of the invention, devices 64 and 66 constitute a pair of substantially identical, N channel type, enhancement mode, VMOS power FET devices of the kind which are commercially available from Siliconix, Inc. under the designation VN66AF. The gate of device 66 is directly connected to a junction point 69. Output connection 31 of high speed driver 18 is coupled to the same point by means of a resistor 68. A diode 70 is connected between junction point 69 and the aforesaid voltage reference point, i.e. ground, and prevents device 66 from the voltage on the gate of device 66 from falling below −0.7 volt with respect to its source.

A voltage divider network 72 includes a resistive leg 74 connected between the drain and gate of device 64 and a resistive leg 76 connected between the gates of devices 64 and 66. Two capacitive legs 78 and 80 are connected in parallel with resistors 74 and 76. These capacitors provided frequency compensation of the voltage divider network by serving as a bypass for higher frequency signals. In a preferred embodiment of the invention, the impedance ratios of legs 74, 76 and 80, 78 respectively, are each 1.5:1, thus placing a larger voltage between the drain and gate of device 64, than between the gates of devices 64 and 66.

In operation, an ultrasonic frequency trigger signal of the type illustrated in FIG. 2 is applied to input terminal 10 from TTL logic preceding this terminal. As previously discussed, the trigger signal switches between different logic levels and preferably takes the form of a selected number of square wave cycles provided at a selected pulse frequency, repeated periodically. Using the exemplary values of FIG. 2, at the logic ZERO level the voltage of the trigger input signal is +0.5 volt. At the logic ONE level the voltage of the trigger signal is +3.5 volt. Thus, under the assumed operation conditions the trigger signal will have a 3 volt swing, switching back and forth at the center frequency of the transducer connected to output terminal 52, e.g. at 3.5 MHz. It will be understood that the pulse frequency, as well as the values chosen for the duration (number of cycles) of the trigger signal and the rate at which the trigger signal is repeated, may all be selectively programmed by suitably selecting or varying the parameters of the TTL circuitry preceding input terminal 10. The implementation of such logic circuitry and the technique for varying the trigger signal are well known in the art, as described in the aforesaid U.S. Pat. No. 3,774,167.

The function of driver section 12, which consists of dual differential line driver 14 and clock drivers 16 and 18, is to translate the power and voltage levels of the applied trigger signal to higher voltage levels. Specifically, the driver section converts the ground-referenced trigger signal, i.e. the periodic, multiple cycle pulse burst shown in FIG. 2, into two signals, each forming a pulse burst complemented and scaled to the translated level. For example, if the trigger signal is at a voltage level of +3.5 volts, denoting a logical ONE, a voltage level of −5 volts will appear on driver output connections 25 and 31 respectively. For a trigger signal voltage level of +0.5 volts denoting a logical ZERO, the voltage at output connections 25 and 31 respectively will be +12 volts, the latter voltage being obtained after subtracting the 3 volt drop across the corresponding MH0011 ? device from the applied +15 volt level. Thus, for each application of a multiple cycle trigger signal, a multiple cycle pulse burst having a voltage swing of 17 volts, (from −5 V to +12 V), is provided at points 25 and 31 of the circuit.

Primary winding 28 of transformer 30 is resistor coupled to the +15 volt supply. When the trigger signal is at logic ZERO and a voltage of +12 volts appears on output connection 25 of clock driver 16, current flow through the primary winding is kept to a minimum. In the absence of a change at output connection 25, no signal is coupled through the transformer to either switching device 36 or 38. The gate and source of each of these devices are therefore at the same voltage and hence both devices 36 and 38 are in the OFF state, i.e. non-conductive.

The +12 volt level also appears at output connection 31 and is coupled to junction point 69 by way of resistor 68 and hence to the gate of switching device 66. Since device 66 is an N channel enhancement mode device, it is turned on as its gate becomes positive with respect to its grounded source. Accordingly, the drain of device 66, as well as the source of device 64 which is connected thereto, are clamped to ground.

If, at this time, output terminal 52 is at ground, the gate of device 64 will be at approximately +7 V due to the action of voltage divider 72. Since its source is clamped to ground, device 64 will have a +7 V gate-to-source voltage, causing it to turn on and actively clamping output terminal 52 to ground. If, on the other hand, output terminal 52 is at a positive voltage when device 66 is ON, the gate of device 64 becomes even more positive due to the voltage divider action and causes device 64 to turn on harder. In either case, both devices 66 and 64 are turned on.

When the input trigger signal switches to the logic ONE level, i.e. from +0.5 volts to +3.5 volts in the example under consideration, the voltage on both output connections 25 and 31 goes to −5 volts. At this point the gate of N channel device 66 is clamped to −0.7 volts, representative of the drop across clamping diode 70. The presence of resistor 68 limits the current flow through the diode and thus serves to protect it, as well as high speed driver 18, from damage. As the gate of device 66 becomes negative relative to its grounded source, the device is turned off. Consequently device 64, which is connected in series with device 66, is turned off as well.

The voltage level change from +12 volts to −5 volts, which causes devices 64 and 66 to turn off, is applied to primary winding 28. As such, the voltage change is coupled through to secondary windings 32 and 34 to apply a negative signal to the gates of switching devices 36 and 38 respectively. These devices, being P channel enhancement mode devices, are now both turned on. Inasmuch as they are connected in series, the drain of device 38, and hence output terminal 52, are effectively clamped to the voltage of power supply terminal 44. Frequency compensated voltage divider network 54, which is connected between power supply terminal 44 and output terminal 52, assures equal sharing of the voltage drop, so that neither device 36 nor device 38 is required to withstand more than one-half of the power supply voltage during such time as devices 36 and 38 are OFF. This allows the voltage at terminal 44 to be twice the rated breakdown voltage of devices 36 and 38. Similarly, voltage divider 72 permits the application of a voltage across connected devices 64 and 66 to extend the breakdown voltage of either device. It will be noted that when the devices 36 and 38 conduct, the voltage applied across series connected devices 64, 66 is that which appears at power supply terminal 41.

When the input trigger signal switches back to logic ZERO, the voltage level on output connections 25 and 31 of the high speed drivers reverts to +12 volts. Devices 66 and 64 are again turned on while devices 36 and 38 turn off. It will be noted that these four devices are never on at the same time. Thus, there is never a DC path between power supply 45 and ground and the power dissipation of the circuit is minimized.

It will be apparent from the foregoing discussion that the energy applied to the transducer by the output signal on terminal 52 is not limited to the energy packed into a single pulse spike, as is the case in prior art circuits. In the present invention the applied energy may be increased by increasing the number of pulses in the trigger signal. A pulse burst applied to terminal 10, consisting of multiple cycles of square wave trigger pulses, is replicated at a selected high voltage at output terminal 52 where it appears as a burst with the identical number of square wave pulses. Thus the energy applied to the ultrasonic transducer, and hence the energy applied to the target by the transducer, may be programmed since the trigger signal is selectively variable as discussed above. This includes the variation of the pulse frequency, which is selected to correspond to the center frequency of the transducer.

Within the limitations of the overall system, the duration of the pulse burst may be selected to contain any number of pulses to apply the desired amount of energy to the target. In an actual embodiment of the invention where a trigger signal having a duration of three cycles was employed at a frequency of 3.5 MHz, the peak signal envelope voltage by the transducer to the target was increased by 10 decibels, i.e. about three times that obtainable by the use of a single pulse spike. Further, as explained above, the amplitude of the waveform applied to the transducer may be selectively varied by adjusting the voltage of the circuit power supply. This constitutes another technique in accordance with the present invention for varying the energy applied to the transducer.

As previously explained, the purpose of maximizing the energy applied to the target is to increase the energy reflected back to the transducer. Echos received by the transducer between successively applied pulse bursts are converted to electrical echo signals. The envelope waveform of each such signal determines the energy content of the echo. In the actual embodiment of the invention discussed above, the peak amplitude of this waveform was observed to increase with the number of cycles of the pulse burst, up to a maximum of four cycles. This is due to the fact that for multiple cycle excitation, as opposed to a single pulse spike, the amplitude of the envelope increases due to energy storage in the transducer. As the number of cycles of the pulse burst was increased above four cycles, the increase in the total reflected energy was due only to the lengthened period of the envelope waveform and no significant rise in amplitude was obtained.

As explained above, in prior art excitation circuits the voltage applied by the single pulse spike divides between the capacitive impedance of the storage capacitor and that of the load itself in accordance with concepts well known in the prior art. In the present invention the voltage drop across the switching devices is negligible and substantially the full voltage on power supply terminal 44 is applied across the load. Thus, the energy transferred to the transducer is maximized by avoiding power losses within the circuit itself. Consistent with the safe voltage limits of the switching devices, which share the applied voltage as explained above, the amplitude of the applied voltage is determined substantially by the power supply alone.

The output signal at terminal 52 constitutes a scaled, replicated waveform of the trigger signal applied to terminal 10. These two signals are coherent with each other, i.e. they stand in a fixed phase relationship to each other. The trigger signal itself, as explained above, may be derived from TTL logic circuitry, or equivalent prior art circuitry preceding terminal 10. Such circuitry may be readily controlled with respect to pulse frequency, burst repetition rate and the number of pulses per burst, in a manner well known in the art. These values, together with the amplitude of the voltage applied from the power supply of the circuit, may be suitably programmed to achieve a heretofore unattainable degree of control of the corresponding pulse bursts applied to the respective transducers of a phased transducer array, and thereby over the ultrasonic beam generated by the array.

The present invention is not limited to the preferred embodiment illustrated in the drawings. As previously explained, the trigger signal may be generated by different types of logic circuitry preceding terminal 10. Likewise, different kinds of circuit arrangements may be substituted for driver section 12, provided only that the required translation of power and voltage levels is carried out.

The values chosen for the components of the voltage divider network and other circuit components will depend on the characteristics of the selected switching devices. Similarly, the voltage at power supply terminal 44 must take into account the maximum safe voltage that may be applied across the switching devices. In the preferred embodiment of the invention where each cascade comprises a pair of series connected switching devices, the voltage at the power supply terminal must not exceed a value equal to twice the maximum safe voltage across each switching device where the devices share the voltage equally. A somewhat smaller power supply voltage is called for where unequal voltage sharing exists. However, the invention is not so limited and both a larger number of switching devices, or a single device, may be substituted for the respective cascades. Further, the impedance ratio of the voltage divider connected across each cascade may differ from that described above.

It will be apparent from the foregoing discussion that numerous variations, modifications, substitutions and equivalents will now occur to those skilled in the art, all of which fall within the spirit and scope of the present invention. Accordingly, it is intended that the invention be limited only by the scope of the claims appended hereto.

What is claimed is:

1. An excitation circuit responsive to an input trigger signal applied during periodically occurring time intervals to provide an output signal in the form of successive, selectively variable pulse burst excitations, said trigger signal being adapted to switch between different logic levels at a selected ultrasonic pulse frequency to apply a selectively determined number of trigger pulses to said circuit during each of said time intervals, said circuit comprising:

a driver section for providing a pair of driver signals, each of said driver signals being adapted to switch between predetermined, intermediate value DC voltage levels of opposite polarity in response to said different trigger signal logic levels;

a power supply including a terminal adapted to provide a selectively variable DC voltage;

an output terminal;

a voltage reference point;

first and second solid state switching means each including gate, source and drain means respectively, said first switching means including at least one P channel MOSFET switching device having a source and drain connection to said power supply terminal and to said output terminal respectively; and said second switching means including at least one N channel MOSFET switching device having a drain and source connection to said output terminal and to said reference point respectively;

first coupling means, including transformer means, connected or coupling one of the driver section signals to the gate means of said first switching means;

second coupling means, including impedance means connected between the driver section and the second switching means gate means connection, for coupling the other one of the driver section signals to the gate means of the second switching means; and means for diode coupling the second switching means gate means to said reference point;

whereby during each of said time intervals said first and second switching means alternate with each other in switching on and off at said selected ultrasonic frequency to provide a pulse burst excitation at said output terminal as a replicated waveform of said trigger signal coherent with the latter, the number of pulses in each burst and the pulse frequency being substantially identical to the selected corresponding values of said trigger signal during each time interval and the amplitude of said pulses being determined by the selected voltage on said power supply terminal.

2. An excitation circuit responsive to an input trigger signal applied during periodically occurring time intervals to provide an output signal in the form of successive, selectively variable pulse burst excitations, said trigger signal being adapted to switch between different logic levels at a selected ultrasonic pulse frequency to apply a selectively determined number of trigger pulses to said circuit during each of said time intervals, said circuit comprising:

a driver section for providing a pair of driver signals, each of said driver signals being adapted to switch between predetermined, intermediate value DC voltage levels of opposite polarity in response to said different trigger signal logic levels;

a power supply including a terminal adapted to provide a selectively variable DC voltage;

an output terminal;

a voltage reference point;

a first voltage divider network connected between said power supply terminal and said output terminal;

first switching means including a plurality of cascade connected P channel MOSFET devices;

second switching means including a plurality of cascade connected N channel MOSFET devices;

each of said devices including a gate, a source and a drain;

first coupling means for transformer coupling one of said driver section signals separately to each gate of said P channel devices of said first switching means;

the source of the first device and the drain of the last device of said plurality of cascade connected P channel devices being coupled to said power supply terminal and to said output terminal respectively, the drain of each device prior to said last P channel device and the source of the subsequent device in said cascade of P channel devices being jointly connected to an intermediate point of said first divider network;

the drain of the first device and the source of the last device of said plurality of cascade connected N channel devices being coupled to said output terminal and to said reference point respectively, the source of each device prior to said last N channel device and the drain of the subsequent device in said cascade of N channel devices being connected to each other;

a second voltage divider network connected between said output terminal and the gate of said last N channel device;

second coupling means including impedance means for coupling the other one of said driver section signals to the gate of said last N channel device;

means for diode coupling said last-recited gate to said reference point; and each gate of said N channel devices prior to said last-recited gate being connected to an intermediate point of said second divider network;

whereby during each of said time intervals said first and second switching means alternate with each other in switching on and off at said selected ultrasonic frequency to provide a pulse burst excitation at said output terminal as a replicated waveform of said trigger signal coherent with the latter, the number of pulses in each burst and the pulse frequency being substantially identical to the selected corresponding values of said trigger signal during each time interval and the amplitude of said pulses being determined by the selected voltage on said power supply terminal.

3. Apparatus in accordance with claim 2 wherein each of said cascades contains a pair of said devices;

said first and second driver signals being provided on first and second output connections respectively of said driver section;

said transformer coupling means including a primary winding and a pair of secondary windings;

said primary winding being coupled to said first output connection and being referenced to one of said intermediate value DC levels;

each of said secondary windings being coupled between the gate and source of respective ones of said P channel devices such that correspondingly phased secondary winding terminals are connected to said last-recited gates; and said first divider network comprising first and second resistive legs each connected in parallel with one of said P channel devices and connected to each other at said intermediate network point, and a first pair of capacitive legs each connected across one of said resistive legs of said first divider network.

4. Apparatus in accordance with claim 3 wherein said second divider network includes a third resistive leg coupled between the drain and the gate of said first N channel device;

a fourth resistive leg coupled between the gates of said pair of N channel devices; and a second pair of capacitive legs each connected across one of said resistive legs of said second divider network.

5. Apparatus in accordance with claim 4 wherein each of said pairs of cascade connected devices comprises two substantially identical VMOS devices.

6. Apparatus in accordance with claim 5 wherein the respective portions of said first divider network which are coupled in parallel with respective ones of said pair of P channel devices have substantially equal impedance values; and wherein the portion of said second divider network which is coupled between the gates of said pair of N channel devices has an impedance value substantially two-thirds that of the network portion connected between the drain and gate of said first N channel device.

7. Apparatus in accordance with claim 6 wherein said voltage reference point is at ground; and further comprising surge protection means including a diode connected across said primary winding, and a parallel resistor-diode combination connected across each of said secondary windings.

8. A pulser circuit for providing an output signal in the form of periodically occurring, selectively variable pulse burst excitations coherent with an input trigger signal which is adapted to switch between different logic levels at a selected ultrasonic frequency;

said circuit comprising:

a driver section for providing first and second driver signals, each of said driver signals being adapted to switch between predetermined intermediate value DC voltage levels of opposite polarity in response to said different trigger signal logic levels;

a power supply including a terminal adapted to provide a selectively variable DC voltage level;

an output terminal;

a voltage reference point;

a first voltage divider network including first and second resistive legs connected between an intermediate network point and said power supply terminal and said output terminal respectively, and a first pair of capacitive legs each connected in parallel with one of said resistive legs;

first solid state switching means comprising a pair of enhancement mode, P channel MOSFET switching devices each including a gate, a source and a drain, the source of the first one of said pair of devices and the drain of the second device being coupled to said power supply terminal and to said output terminal respectively, the drain of said first device and the source of said second device being jointly connected to said intermediate point of said first divider network;

transformer means including a primary winding and a pair of secondary windings;

means for referencing said primary winding to one of said intermediate value DC voltage levels;

means for coupling said first driver signal to said primary winding;

each of said secondary windings being coupled between the gate and source of a respective one of said P channel devices such that the gate-connected winding terminals are in phase with each other;

second solid state switching means coupled between said output terminal and said voltage reference point and including gate, source and drain means, means for resistively coupling said second driver signal to a connection of said gate means, means for diode coupling said gate means connection to said reference point; and a second voltage divider network connected between said output terminal and said gate means connection;

whereby said first and second solid state switching means are alternately switched on and off at said selected ultrasonic frequency to provide said periodically occurring pulse burst excitations at said output terminal as a replicated waveform of said trigger signal coherent with the latter, the number of pulses in each of said pulse burst excitations, the pulse frequency and the rate of burst repetition respectively, being substantially identical to the corresponding selected values of said trigger signal, and the pulse amplitude being determined by the selected voltage level on said power supply terminal.

9. A circuit in accordance with claim 8 wherein said second switching means includes a pair of enhancement mode, N channel MOSFET switching devices each including a gate, a source and a drain;

the drain of the first one of said N channel devices and the source of the second N channel device being coupled to said output terminal and to said reference point respectively;

the source and drain of said first and second N channel devices respectively being connected together;

the gate of said second N channel device being connected to said resistive coupling means and to said diode coupling means respectively;

said second divider network including a third resistive leg connected between the drain and gate of said first N channel device, a fourth resistive leg connected between the gates of said first and second N channel devices, and a second pair of capacitive legs each connected in parallel with one of said third and fourth resistive legs.

10. A circuit in accordance with claim 9 wherein each of said pairs of switching devices comprises two substantially identical VMOS devices;

the impedance of said first resistive leg and of its parallel capacitive leg respectively being substantially equal to the impedance of said second resistive leg and the capacitive leg in parallel therewith; and the impedance of said third resistive leg and of its parallel capacitive leg respectively having a ratio of substantially 1.5:1 with respect to the impedance of said fourth resistive leg and the capacitive leg in parallel therewith.

11. A circuit in accordance with claim 10 wherein said reference point is at ground; and further comprising surge protection means including a diode connected across said primary winding, and a parallel resistor-diode combination connected across each of said secondary windings.

12. Apparatus in accordance with claim 9 and further including an ultrasonic transducer connected between said output terminal and said reference point and having a predetermined operating frequency range, said transducer being responsive to the application of said pulse burst excitations substantially at the center frequency of said operating range to radiate bursts of ultrasonic energy to a target;

whereby said radiated energy is programmed in accordance with said selected trigger signal values and said selected pulse amplitude.

* * * * *